United States Patent [19]

Ballato et al.

[11] Patent Number: 4,785,232
[45] Date of Patent: Nov. 15, 1988

[54] CONTACTLESS HALL COEFFICIENT MEASUREMENT APPARATUS AND METHOD FOR PIEZOELECTRIC MATERIAL

[75] Inventors: Arthur Ballato, Long Branch; Herbert A. Leupold, Eatontown, both of N.J.

[73] Assignee: The United States of America as represented by the Secretary of the Army, Washington, D.C.

[21] Appl. No.: 65,820

[22] Filed: Jun. 5, 1987

[51] Int. Cl.$^4$ ............................................. G01R 29/22
[52] U.S. Cl. ........................................................ 324/56
[58] Field of Search ..................... 324/56, 109, 96, 62; 356/33, 364; 73/DIG. 4

[56] References Cited

U.S. PATENT DOCUMENTS

| | | | |
|---|---|---|---|
| 3,165,651 | 1/1965 | Bechmann | 310/9.7 |
| 3,202,846 | 8/1965 | Ballato et al. | 310/9.7 |
| 4,092,588 | 5/1978 | Desormiere et al. | 324/56 |
| 4,158,805 | 6/1979 | Ballato | 324/56 |
| 4,220,915 | 9/1980 | Kawamoto et al. | 324/62 X |
| 4,353,027 | 10/1982 | Ballato et al. | 324/56 |
| 4,446,432 | 5/1984 | Dworsky et al. | 324/56 X |
| 4,668,909 | 5/1987 | Hickernell et al. | 324/56 |

OTHER PUBLICATIONS

Ballato et al., "Lateral Field Equivalent Networks and Piezo-Coupling Factors of Quartz Plates Driven in Simple Thickness Modes", IEEE Transactions on Ultrasonics, Ferroelectrics and Frequency Control, vol. UFFC-33, No. 4, Jul. 1986, pp. 385-393.
"A Method of Measuring Specific Resistivity and Hall Effect of Discs of Arbitrary Shape" by L. J. van der Pauw; Philips Res. Repts. 13, Feb. 1958, pp. 1-9.
"A Method of Measuring the Resistivity and Hall Coefficient on Lamellae of Arbitrary Shape" by L. J. van der Pauw: vol. 20, Philip Technical Review, pp. 220-224, 1958/59.

*Primary Examiner*—Reinhard J. Eisenzopf
*Assistant Examiner*—Warren S. Edmonds
*Attorney, Agent, or Firm*—Sheldon Kanars; John T. Rehberg

[57] ABSTRACT

A method and apparatus for the contactless, non-destructive measurement of Hall coefficient and resistivity of a piezoelectric semiconductor sample. The material to be tested is formed in a disk which is supported at its edge by a holder. The disc is free to vibrate. Two pairs of electrodes, placed above and below the sample, excite the sample into and beyond piezoelectric resonance. Then a magnetic field is applied to the sample and the sample again driven into and beyond resonance. Comparison between the performance of the disk before and after application of the magnetic field yields data from which Hall coefficient can be determined.

9 Claims, 5 Drawing Sheets

CONTACTLESS HALL COEFFICIENT MEASUREMENT APPARATUS AND METHOD FOR PIEZOELECTRIC MATERIAL

The invention described herein may be manufactured, used and licensed by or for the Government without payment to us of any royalty thereon.

BACKGROUND OF THE INVENTION

1. Field of the Invention

Broadly speaking, this invention relates to semiconducting, crystalline materials and methods of measuring their physical properties. More particularly, this invention relates to non-destructive, contactless methods and apparatus for accurately measuring the Hall coefficient and resistivity of semiconducting crystalline materials. The method and apparatus disclosed herein may be applied to piezoelectric semiconducting crystals particularly those in cubic class 43 m, which includes most of the II-VI and III-V compounds such as gallium arsenide.

2. Description of the Prior Art

There is presently great interest in accurately measuring the Hall coefficient and resistivity of high purity semiconductor materials such as gallium arsenide. This latter material is especially important because it exhibits a large band gap which renders it stable at high temperatures, while its large mobility permits high frequency devices to be made from the material.

Resistivity and Hall coefficient measurements at different temperatures play an important part in research on semiconductors, for it is from these quantities that the mobility and concentration of the charge carriers are found.

The Hall effect is discussed extensively in physics literature and is well known to those skilled in the semiconductor art. Briefly, if a magnetic field is applied in a direction normal to the direction of current flow in a conductor or semiconductor, a voltage is developed at right angles to both the direction of initial current flow and the direction of the magnetic field. In a semiconductor in which, for example, electrons dominate conduction, the Hall coefficient is given by:

$$R_n = (1/en) \quad (1)$$

where $R_n$ is in the electron Hall coefficient, e is the electronic charge, and n is the electronic concentration.

The conductivity is given by:

$$\sigma = ne\mu_n \quad (2)$$

where n and e are defined above and $\mu_n$ is the electron mobility.

In a semiconductor in which both electrons and holes contribute substantially to the conduction process, the Hall coefficient is given by:

$$R = (R_p\sigma_p^2 + R_n\sigma_n^2)/(\sigma_n+\sigma_p)^2 \quad (3)$$

where
R is the Hall coefficient,
$R_p$ and $R_n$ are the hole and electron Hall coefficients respectively as defined above,
$\sigma_p$ and $\sigma_n$ are the hole and electron conductivities as defined above.
Also the overall sample conductivity is given by:

$$\sigma = \sigma_n + \sigma_p = ne\mu_n + pe\mu_p \quad (4)$$

where $\mu_p$ is the hole mobility, p is the hole concentration, and other quantities have been defined above.

Those concerned with the measurements of Hall coefficients and resistivity have constantly sought methods and apparatus which will disturb the sample under test as little as possible. Present methods of measuring the Hall coefficient involve attaching a system of probes or electrodes to the surface of a specially cut sample. Apart from the problems of stray fields and very minute currents, the attachments which are made to the surface of the sample under test tend to interfere with measurement because the surface of the crystal is disturbed during the measurement process. A detailed discussion of the traditional methods of measuring the Hall coefficient is provided in the articles by L. J. Van der Pauw in Philips Research Reports, Vol. 13, 1958, pp. 1-9 and Philips Technical Review, Vol. 20, 1958-1959, pp. 220-224.

The instant invention makes use of the fact that crystals in class $\overline{43}$ m are piezoelectric and can hence be made into acoustic resonators. As will be explained below, the contactless nature of the Hall coefficient measurement technique disclosed and claimed herein stems from the discovery that piezoelectric vibrators may be driven by an RF field in an air gap.

U.S. Pat. No. 4,353,027, entitled "Contactless Resistivity Measurement Method and Apparatus" issued to the present inventor and G. Iafrate, discloses a contactless measurement method and apparatus which yields resistivity data. The present invention provides both hall coefficient data and resistivity data without the need for contacting the sample.

SUMMARY OF THE INVENTION

Accordingly, it is an object of the present invention to provide a method and apparatus for measuring the Hall coefficient of a semiconductor sample which does not require physical contact with the sample.

Another object of the present invention is to provide a method and apparatus for measuring the resistivity of a semiconductor sample without physically contacting the sample.

A still further object of the present invention is to provide a method and apparatus for obtaining data from which semiconductor carrier mobilities and concentrations may be deduced in a mass-production environment.

Yet another object of the present invention is to provide a method and apparatus for fast and inexpensive semiconductor material testing and evaluation.

One of the more significant advantages of the instant invention is the contactless nature of the measurement process which insures that surface contamination and or degradation of the sample under test is prevented, as is the need to attach and remove deposited electrodes from the sample. The invention also provides an accuracy which is very high and which is virtually immune to the influences of stray currents.

While it is anticipated that the instant invention will be used in connection with the characterization of high purity semiconductor materials such as gallium arsenide, it is not so limited. The method is applicable to all piezoelectric semiconducting crystals, particularly those in cubic class $\overline{43}$ m, which includes most of the II-VI and III-V compounds.

In the preferred embodiment of the present invention a disk of semiconducting crystalline material is supported in an air gap in such a manner that the disk is free to vibrate. An alternating electric field is established in the air gap. The alternating electric field establishes lateral excitation of thickness vibration modes in the crystal. The frequency of the alternating electric field is adjusted to drive the disk into and beyond resonance. Then a magnetic field is applied in the direction of the crystal plate thickness, namely the direction perpendicular to the direction of the lateral electric field which excites the crystal. The frequency of the alternating electric field is again adjusted to drive the disk into and beyond resonance. Evaluation of the piezoelectric current before and during application of the magnetic field provides the data from which the Hall coefficient, R, may be determined. (Resistivity data may be obtained merely from an analysis of the data generated before application of the magnetic field, as outlined in the aforementioned U.S. Pat. No. 4,353,027).

BRIEF DESCRIPTION OF THE DRAWINGS

Further objects and advantages of the present invention will become apparent with those familiar with the art upon examination upon the following detailed description and accompanying drawings in which.

DETAILED DESCRIPTION OF THE PREFERRED EMBODIMENTS

Figure 1:
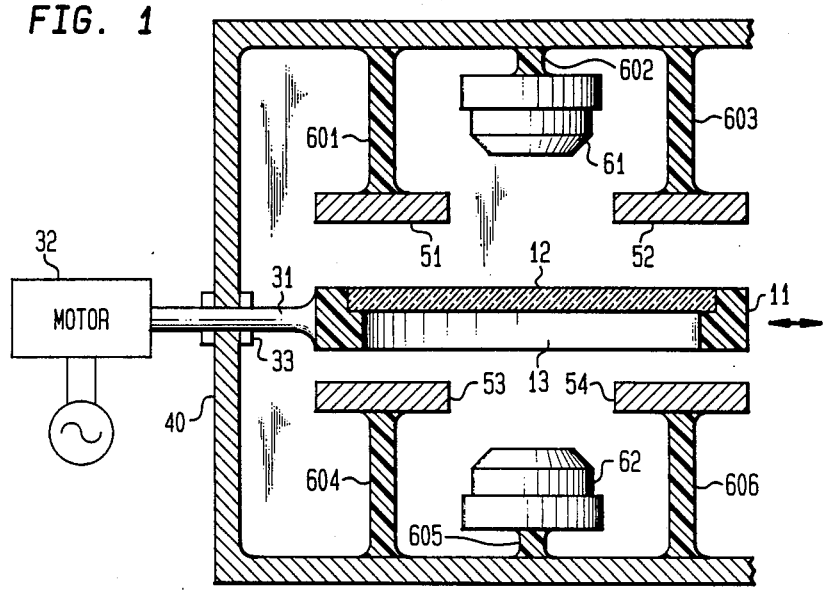
FIG. 1 is a partial cross-sectional view of a preferred embodiment of the present invention.

Referring to the drawings, wherein like numerals refer to like components throughout, and particularly to FIG. 1, reference numeral 12 designates a disk-shaped, piezoelectric semiconductor test sample whose resistivity and Hall coefficient are to be measured. Sample 12 is held in a non-conducting sample holder 11 which supports the semiconductor disk 12 about the outer edges. Holder 11 may be made from Teflon ™. Holder 11 has a hole 13 in its underside. Thus the central portion of disk 12 is free to vibrate and disk 12 may be subjected to both electric and magnetic fields from above and below. Holder 11 is connected via leadscrew 31 to motor 32. Leadscrew 31 is journaled at 33 in a metallic shielding wall 40. Motor 32 is thus capable of moving holder 11 and sample 12 back and forth in the horizontal direction illustrated in FIG. 1. Electrodes 51 and 52 are positioned horizontally above sample 12. Electrodes 53 and 54 are positioned below sample 12. Electrodes 51 and 53 are electrically connected together and simultaneously energized. Electrodes 52 and 54 are also electrically connected together and simultaneously energized. (Interconnection of the four electrodes is illustrated further in FIGS. 6 and 8A–B which will be discussed subsequently). Electromagnets 61 and 62 are positioned above and below sample 12. The gap between electrodes 51 and 52 is preferably 1 to 6 times the thickness of sample 12. A similar sized gap is desired between electrodes 53 and 54. It is desirable to place the electrode pairs as close to the sample as possible to maximize excitation of the sample. When electrodes 51–54 are energized, sample 12 is driven into thickness mode vibration by the lateral field excitation created by the electrodes 51–54.

In general, lateral field excitation (occasionally termed parallel field excitation) is a technique well known to those skilled in the art. Examples of lateral field excitation are given in U.S. Pat. No. 3,165,651, "Piezoelectric Crystal Apparatus" issued to R. Bechmann, and U.S. Pat. No. 3,202,846, "Piezoelectric Crystal Element" issued to one of the present inventors and R. Bechmann.

It is significant to note in FIG. 1 that no electrical contact is made with sample 12. The sample may be excited into and beyond resonance solely by the application of the proper frequency to electrodes 51–54.

Electromagnets 61 and 62, create a magnetic field which is perpendicular to the electric field created between electrodes 51 and 52 and electrodes 53 and 54.

Electromagnet 61 is placed somewhat above the plane determined by electrodes 51 and 52 to avoid interference with the electric field created by those electrodes. Similarly, electro magnet 62 is placed somewhat below the plane determined by electrodes 53 and 54 to avoid interference with the electric field created by those electrodes.

Electrodes 51–54 produce only a localized disturbance in disk 12. The acoustic vibration of disk 12 is localized by the energy trapping phenomenon. Consequently, different regions of the disk may be tested in a continuous manner as disk 12 is moved relative to electrodes 51–54. Motor 32 serves to move disk 12 laterally between electrodes 51–54 so that different regions of sample may be tested. Metallic enclosure 40 serves to completely shield electrodes 51–54, magnet 61 and 62 and sample 12. (Only a section of metal enclosure 40 is shown in the drawing for simplicity). Electrodes 51–54 may be supported within metal enclosure 40 by supports 601, 603, 604 and 606. Similarly, magnets 61–62 may be supported by supports 602 and 605.

Figure 2:
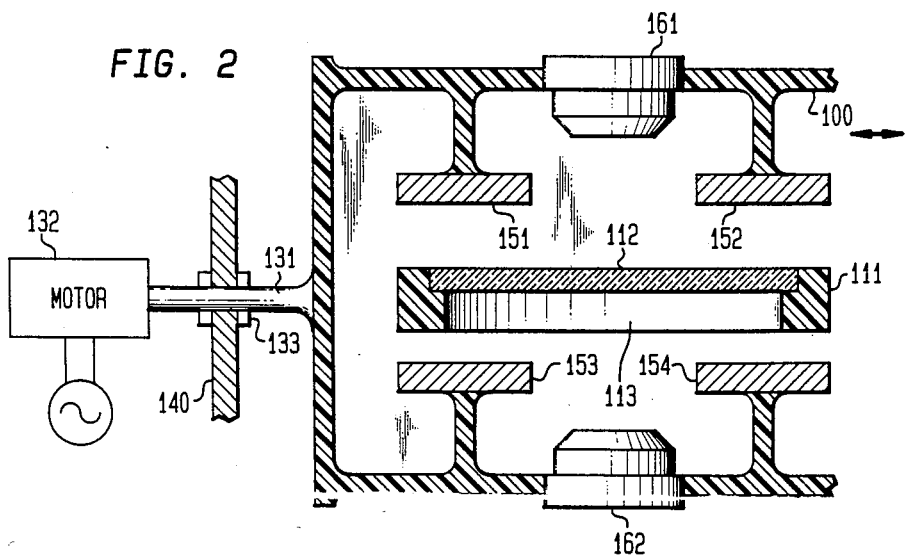
FIG. 2 is a partial cross-sectional view of an alternative embodiment of the present invention.

FIG. 2 illustrates another equipment arrangement which may be employed in the practice of the present invention. In contrast to FIG. 1 in which the disk 12 was moved relative to electrodes 51–54 and electromagnets 61–62, the embodiment of FIG. 2 features a stationary sample 112 held within a holder 111 and an insulating framework 100 for moving electrodes 151–154 and electromagnets 161–162 about sample 112. Sample holder 111 has a hole 113 in its bottom surface. Insulating frame 100 is attached 133 protrude through shielding enclosure 140. Enclosure 140 shields the entire sample 112 and framework 100. Motor 132 moves framework 100 with its attached electrodes 151–154 and magnets 161 and 162 back and forth about disk 112.

Figure 4:
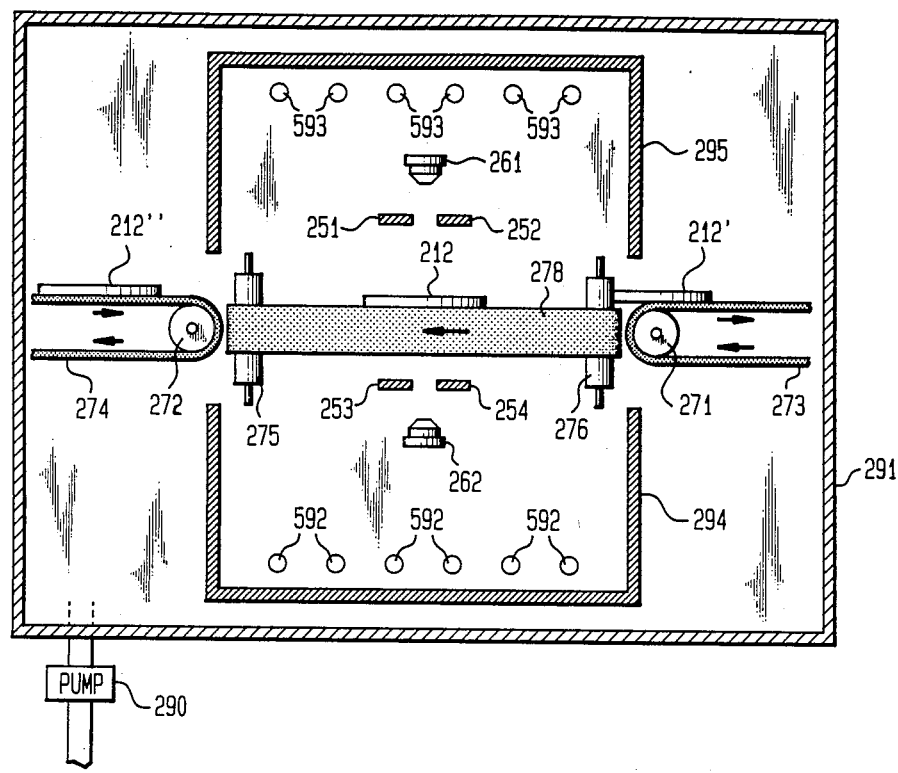
FIG. 4 is a partial cross-sectional view of an alternative embodiment of the present invention.
Figure 5:
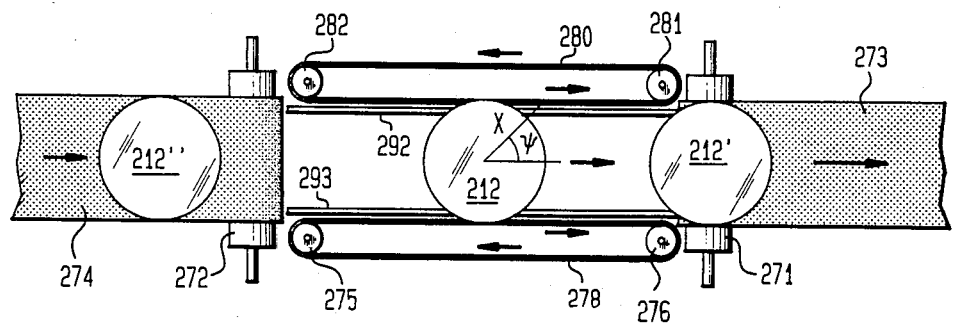
FIG. 5 is a partial top view of the apparatus shown in FIG. 4.

While the apparatus just described in FIGS. 1 and 2 may be suitable for testing of individual samples, mass production testing with the apparatus of FIGS. 1 and 2 may be time consuming. The embodiment illustrated in FIGS. 4 and 5 is suitable for mass production testing. As illustrated in FIGS. 4 and 5, disks 212, 212', and 212'' to be tested enter via a first horizontal conveyor belt 274 supported by roller 272 (and another not illustrated in the drawing). The disks are then gripped at their outer edges by a pair of vertical conveyor belts 278 and 280, respectively supported by vertical rollers 275-276 and 282-281. The disks are translated on thin dielectric support rails 292 and 293 located near the disk edges, leaving the disks free to vibrate acoustically. The disks then exit via a second, horizontal conveyor belt 273 supported by roller 271 (and another roller not shown in the drawing). As the disks are transported by conveyors 278 and 280, they pass between upper electrode pair 251-252 and lower electrode pair 253-254. All four electrodes 251-254 are connected in the manner afore-described to provide lateral field excitation of all disks. Furthermore, electromagnets 261 and 262 are positioned respectively above and below the sample to induce the Hall effect described previously. Electromagnet 261 is positioned between and above the gap between electrodes 251 and 252, while electromagnet 262 is positioned between and below the gap between electrodes 253 and 254. The entire apparatus is shielded by both an upper and lower metallic enclosure 295 and 294 respectively and the entire apparatus is positioned within an evacuated vacuum chamber 291. For simplicity, conventional drive motors for the conveyor belts and the electrical connection to the electrodes have been omitted.

It is advantageous to include heating elements 592 and 593 within shields 294 and 295 so that, in effect the measuring apparatus is shielded by placing it in an oven. State of the art ovens are capable of maintaining temperatures constant within a millikelvin, but such control is probably not needed for the instant application. The reason that the entire apparatus is advantageously placed within a vacuum chamber is that air loading dampens the resonance of vibrators, particularly those operating in the extensional mode (as a (111) cut does). Doubly rotated cuts where the modes are coupled, usually have vibrations where at least some component of the mechanical motion is normal to the surface and thus susceptible to air dampening. Fortunately, to overcome this difficulty only a soft vacuum is required; the apparatus making the resonance measurements thus requires some provision for pulling the vacuum, e.g. as might be obtained by a small pump 290 connected to vacuum chamber 291.

Of course, the apparatus of FIGS. 4 and 5 could be modified in a manner analogous to that depicted in FIG. 2. Such a modification would have electrodes 251-254 together with magnets 261 and 262 mechanically mounted so that they might translate back and forth from side to side to measure disks 212 as they pass beneath.

Figure 9:
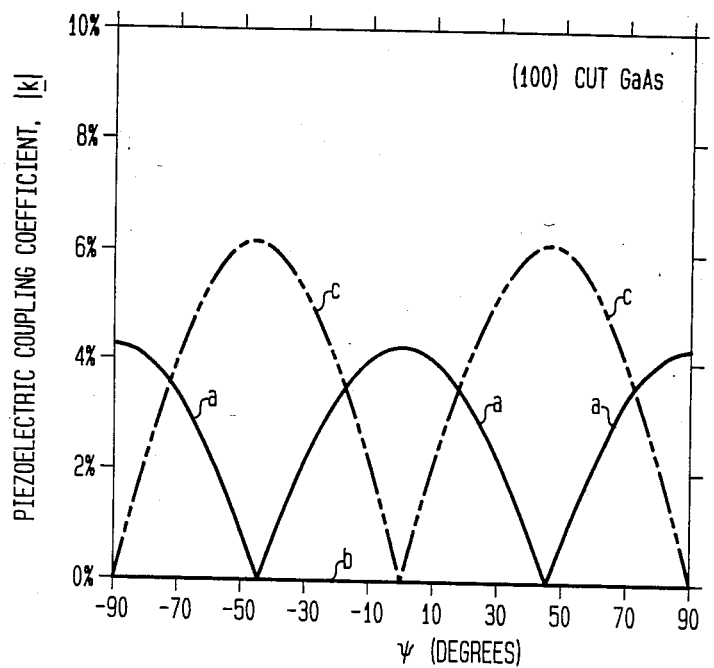
FIGS. 9, 10, and 11 are graphs of the piezoelectric coupling coefficient for gallium arsenide in various crystal cuts and orientations.
Figure 10:
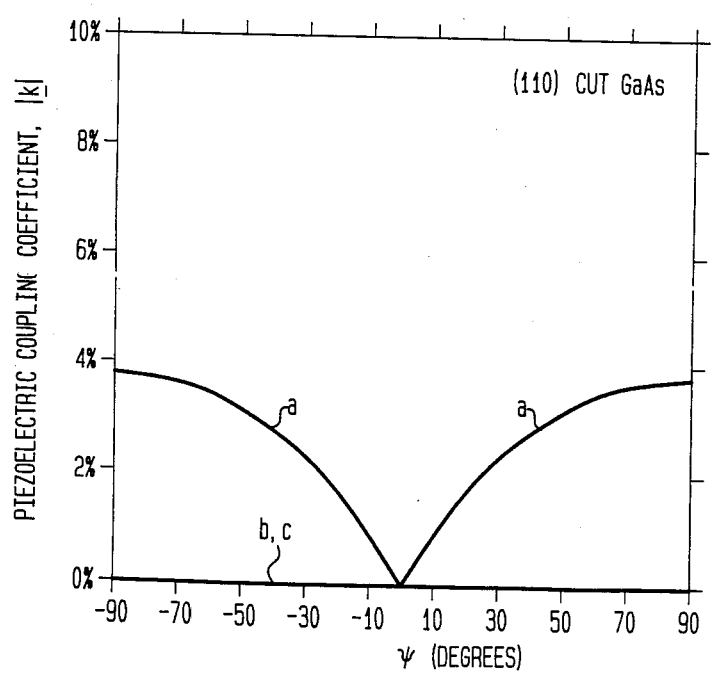
Figure 11:
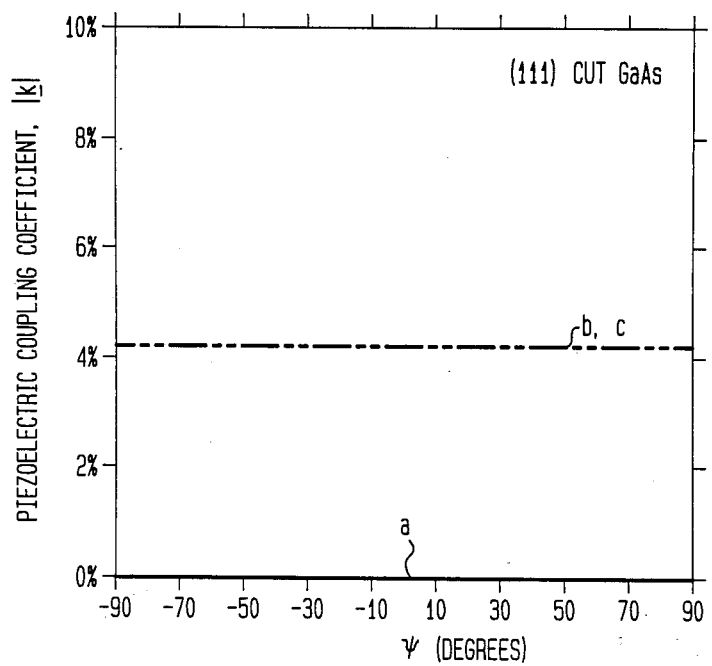

In all of the embodiments just discussed, (i.e. FIGS. 1, 2, 4, and 5) the piezoelectric excitation of the sample wafer may be enhahced by proper orientation of the sample with respect to the driving electrodes. FIGS. 9-11 are graphs of the lateral field piezoelectric coupling coefficients, for various gallium arsenide crystal cuts, namely (100), (110), (111). Each of the graphs of FIGS. 9-11 illustrates the piezoelectric coupling coefficients for the a, b, or c vibrational mode as a function of azimuthal angle $\psi$. For example, examination of FIG. 9 shows that for a (100) cut gallium arsenide crystal, the "c" vibrational mode is most strongly excited when $\psi = \pm 45°$. The angle $\psi$ is measured from the x axis of the crystal. Thus, examination of wafer 212 in FIG. 5 shows that the wafer has been oriented with respect to electrodes 251-154 (which are above and below the plane of the figure) so that the angle $\psi$ obtains between the electric field lines and the x axis of the crystal sample. If the sample were a (100) cut crystal and $\psi$ were chosen to be equal to $\pm 45°$, then maximum excitation of the "c" mode would be produced and the measurements taught by the present invention most easily facilitated.

Examination of FIG. 9 shows that a nearly equally acceptable result may be obtained by excitation of the "a" mode in a (100) cut crystal. Consequently, for a (100) cut crystal, orientations of the crystal with respect to the driving electrodes having angles of $\psi = 0°$ or $\pm 90°$ are also acceptable. Similarly, examination of FIG. 10 shows that the "a" vibrational mode of an (110) cut gallium arsenide crystal is most strongly excited when $\psi = \pm 90°$. And finally, examination of FIG. 11 illustrates that for (111) cut gallium arsenide crystal that any orientation of the crystal will produce excitation of the "c" and "b" modes of vibration, while providing no excitation of the "a" mode of vibration.

Of course, orientation of the crystal sample in the manner just described could also be performed in the apparatus embodiments of FIGS. 1 and 2.

FIGS. 9-11 display the piezoelectric coupling behavior of lateral field excitation of galium arsenide. However, any member of crystal class 43 m has but one independent piezoelectric coefficient, and therefore, while the absolute levels of the coupling coefficients will vary due to size of the independent piezoelectric coefficient, dielectric constant and elastic constants, the geometric shapes of the curves in FIGS. 9-11 will be the same for all such crystals.

Figure 3:
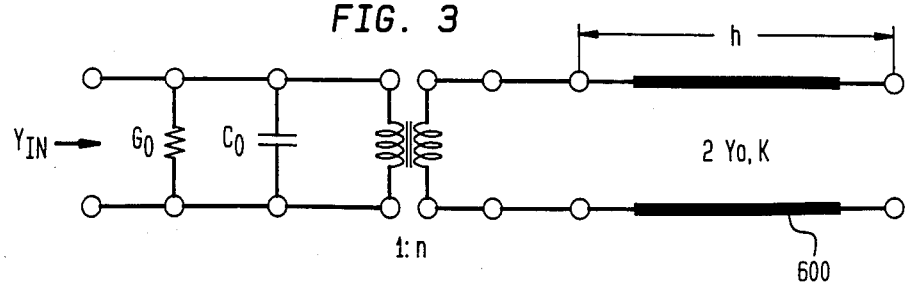
FIG. 3 is a circuit diagram of the equivalent circuit of a semiconductor tested according to the present invention.

In all of the preceding embodiments (i.e., FIGS. 1, 2, 4-5), the mechanically vibrating semiconductor appears at the driving electrodes 51-54 to have the equivalent electrical network shown in FIG. 3. In FIG. 3, a parallel combination of admittance G and capacitance, C is inductively coupled to an acoustic transmission line 600 of length h (the sample thickness being Zh) which has a characteristic admittance Yo and wavenumber K. In this model, the sample resistivity is principally manifested in the admittance G. (The influence of resistivity upon the transmission line admittance Y and wavenumber K is almost always negligible, but the element $G_o$ is inversely proportioned to resistivity. As will be illustrated further below, application of the magnetic field created by magnets 161 and 162 (in FIG. 2) or 261 and 262 (in FIG. 4) or 61 and 62 ( in FIG. 1) alters the value of $G_o$. The change in the value of $G_o$ is a measure of the Hall effect and thus, the carrier concentrations of the sample. One skilled in the art, using the model illustrated in FIG. 3, and noting the change in $G_o$ caused by application of the magnetic field can calculate both the Hall coefficient and resistivity of the sample.

Figure 6:
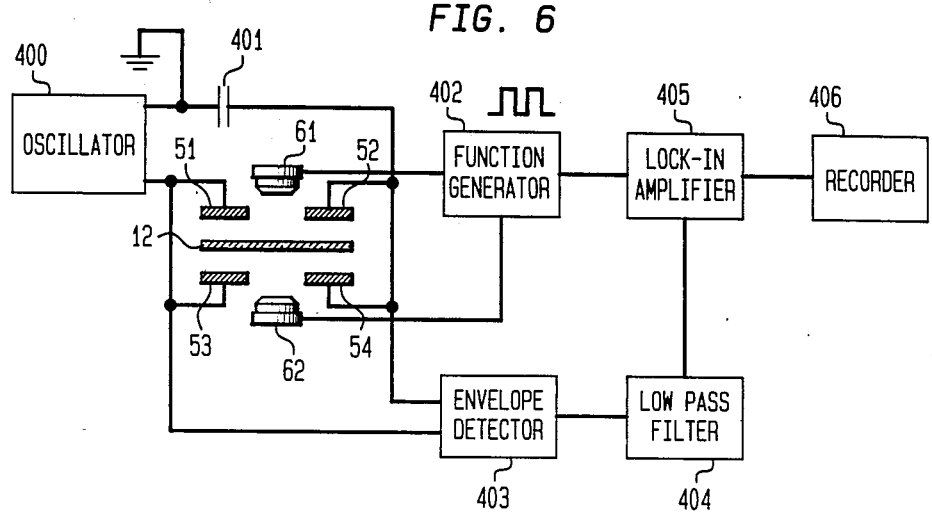
FIG. 6 is a circuit diagram employed in a preferred embodiment of the present invention.

Each of the apparatus shown in FIG. 1, FIG. 2, or FIGS. 4-5 may be wired in a circuit similar to that shown in FIG. 6. For simplicity, it will be assumed that the apparatus of FIG. 1 is described in FIG. 6, although it is clear that the other mentioned embodiments will work as well. FIG. 6 illustrates piezoelectric disk 12 (with holder 11 removed for clarity). Electrodes 51 and 52 are positioned above disk 12, while electrodes 53 and 54 are positioned below disk 12. Lateral excitation is achieved by connecting electrodes 51 and 53 together, while also connecting electrodes 52 and 54 together. Electrode pair 51 and 53 is connected to one output port of oscillator 400, while electrode pair 52 and 54 is connected through isolation capacitor 401 to the other output port of oscillator 400. Magnets 61 and 62 are connected to function generator 402. Detection of the influence of the magnetic field, which contains the Hall effect information, is considerably enhanced by switching the magnet on and off in a square-wave fashion, or by using a sinusoidal excitation of the magnet. The resulting magnetic field changes should be accomplished at repetition rates or frequencies much less than the plate acoustic resonances. The plate acoustic resonances are typically in the MHz range, so that magnetic field changes in the kHz range or lower are suitable.

Electrodes 51–54 may also be simultaneously used to detect the influence of the magnetic field by connecting them to envelope detector 403. The output of envelope detector 403 is fed to low pass filter 404 and thence to lock-in amplifier 405. Function generator 402 is also connected to lock-in amplifier 405. Envelope detector 403 removes the RF component from the signal received by electrodes 51–54. Low pass filter 404 eliminates high frequency noise. Lock-in amplifier 405, preferentially selects signal information with the same periodicity as the output of function generator 402 (i.e., with the same periodicity as the electromagnetic cycling). The output of lock-in amplifier 405 is preserved by recorder 406.

Figure 7A:
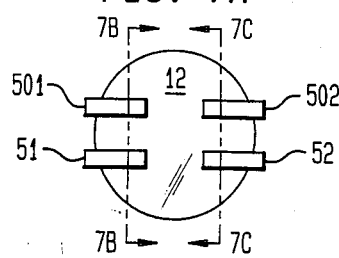
FIG. 7 is a partial top view of an alternative embodiment of the present invention.
FIGS. 7B–C are cross-sectional views of the embodiment of FIG. 7A.
Figure 7B:
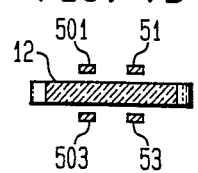
Figure 7C:
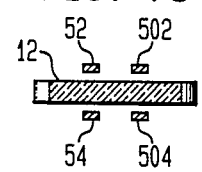

Alternatively, another set of electrodes may be used to pick up the piezoelectric signal emitted by the disk. FIGS. 7A–7C and FIGS. 8A–B illustrate the use of secondary electrodes. FIGS. 7A–7C illustrate the placement of the secondary electrodes relative to the original excitation electrodes. In FIG. 7A, a top view of a typical piezoelectric disk 12 (which may be located within any of the configurations illustrated in FIGS. 1, 2, 4 or 5) is shown. Excitation electrodes 51 and 52 are positioned above piezoelectric disk 12. Secondary electrodes 501 and 502 are positioned generally parallel to (and slightly apart from) excitation electrodes 51 and 52. Examination of FIGS. 7B and 7C, which show cross-sectional views of plate 12 also illustrate excitation electrodes 53 and 54 on the bottom of plate 12. Similarly, secondary electrodes 503 and 504 are also positioned on the bottom of plate 12. All of the secondary electrodes 501–504 are oriented in a direction generally parallel to the directions of the primary excitation electrodes 51–54. Assuming that the orientations prescribed by FIGS. 9–11 have been achieved with respect to disk 12 and primary electrodes 51–54, the secondary electrodes 501–504, if oriented parallel to the primary excitation electrodes, will be positioned to receive the maximum signal generated by piezoelectric disk 12.

Figure 8A:
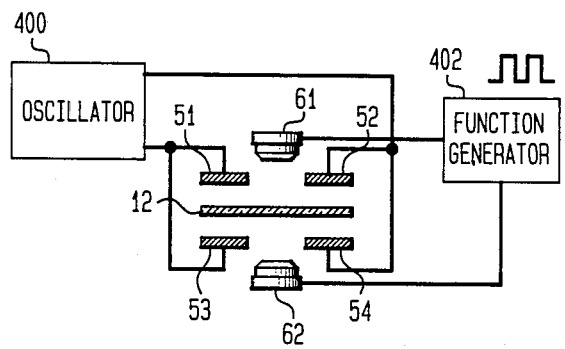
FIGS. 8A and 8B are circuit diagrams employed with the embodiments of FIGS. 7A–7C.
Figure 8B:
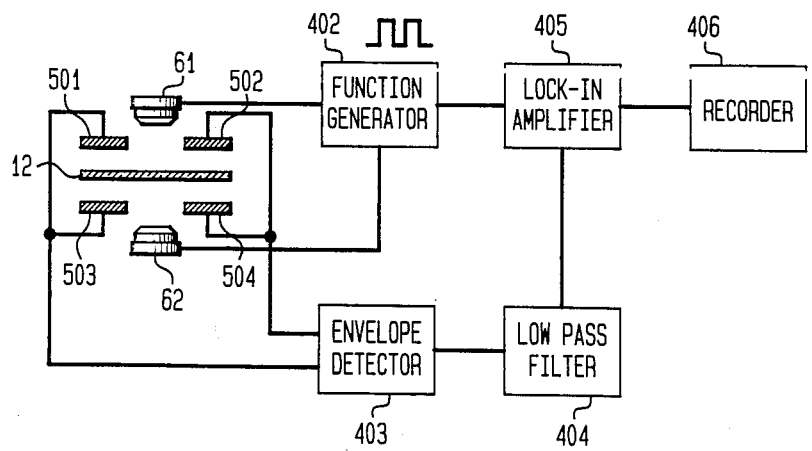

FIGS. 8A and 8B illustrates the wiring connections between both the primary excitation electrodes and the secondary electrodes. In FIG. 8A the connections between primary electrodes 51–54 are illustrated. Comparison of FIG. 8A and FIG. 6 shows that primary electrodes 51–54 are connected in a similar manner in both figures. As can be seen from a examination of FIG. 8, electrodes 51 and 53 are connected together and also to one output port of oscillator 400. Similarly, electrodes 52 and 54 are connected together and then to the other output port of oscillator 400. Magnets 61–62 are both connection to function generator 402.

FIG. 8B illustrates the circuitry used to detect the signals emitted by piezoelectric disk 12. The driving oscillator 400 and primary electrodes 51–54 have been omitted for clarity. Secondary electrodes 501 and 503 are connected together and fed to envelope detector 403. Similarly, secondary electrodes 502 and 504 are connected together and fed to the same envelope detector 403. The output from envelope detector 403 is directed to a low pass filter 404 to remove the RF component of its signal. The output of low pass filter is processed by lock-in amplifier 405. Lock-in amplifier 405 is preferentially biased by function generator 402 to detect an average signal with a periodicity equal to that imposed upon magnets 61 and 62. The output of lock-in amplifier 405 is preserved by recorder 406. The signal processing equipment illustrated in FIG. 8B is the same as that illustrated in FIG. 6, the only difference being the presence of an additional four secondary pickup electrodes.

Figure 12:
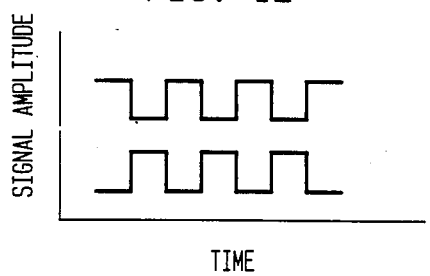
FIG. 12 is a graph illustrating a typical waveform obtained by the circuits of FIGS. 6 or 8A–B.

Utilizing either the circuit of FIG. 6 or the circuit of FIGS. 8A–B one skilled in the are may analyze the data provided by lock-in amplifier 405 to recorder 406 in conjunction with the resistivity of the particular sample region examined. Generally, the output of lock-in amplifier 405 will have the appearance of the signal illustrated in FIG. 12. The Hall coefficient information is contained within the amount of modulation exhibited by the output of lock-in amplifier 405.

The illustrative embodiments herein are merely a few of those possible variations which will occur to those skilled in the art while using the inventive principles contained herein. Accordingly, numerous variations of invention are possible while staying in the spirit and scope of the invention as defined in the following claims and their legal equivalents.

What is claimed is:

1. Apparatus for the non-destructive, contactless measurement of the Hall coefficient of a piezoelectric material comprising:

first and second pairs of spaced apart electrodes, said electrode pairs defining an air gap between said electrode pairs;

means for positioning a disk of said piezoelectric material within said air gap, said disk having upper and lower surfaces which are generally parallel;

means for establishing a magnetic field within said air gap, said magnetic field being generally perpendicular to said upper and lower surfaces of said disk;

means, connected to said electrodes, for establishing a first alternating electric field in said air gap, said first alternating electric field causing said disk to vibrate piezoelectrically and to generate a second alternating electric field;

means for measuring said second electric field caused by said piezoelectric vibration, said measuring means being connected to at least one pair of said electrodes.

2. The apparatus according to claim 1 further comprising means for establishing a vacuum around said air gap and said disk.

3. The apparatus according to claim 1 further including means for electrically shielding said air gap and said disk from external electrical fields.

4. The apparatus of claim 1 further including means for establishing relative motion between said electrodes and said disks, whereby measurements may be made at several locations on said disk.

5. The apparatus according to claim 1 wherein said disk positioning means includes a non-conductive holder dimensioned to support said disk only about the outer periphery thereof, whereby said disk is free to vibrate.

6. The apparatus according to claim 1 wherein said means for establishing a magnetic field is an electromagnet driven by an electric current, and further including means for modulating said electric current, thus causing modulation of said magnetic field.

7. The apparatus according to claim 1 wherein said positioning means comprises:
   a first conveyor belt, for transporting said disk toward said air gap;
   a pair of insulating rails enclosing said gap;
   a second and third spaced apart conveyor belts, both positioned perpendicular to said first conveyor belt, for receiving said disk from said first conveyor belt and transporting said disk along said insulating rails through said air gap, said disk being supported at its periphery so that said disk is free to vibrate in said air gap;
   a fourth conveyor belt, parallel to said first conveyor belt for receiving disk from said second and third conveyor belts for transporting said disk away from air gap.

8. The apparatus according to claim 7 further including an envelope detector connected to said electrodes; and a low pass filter connected to said envelope detector; a lock-in amplifier connected to said low pass filter; and a recorder connected to said lock-in amplifier.

9. A non-destructive, contactless method of measuring the Hall coefficient of a piezoelectric material comprising the steps of:
   supporting a disk of said piezoelectric material in a gap such that said disk is free to vibrate;
   creating an alternating electric field in said gap thereby causing said disk to vibrate piezoelectrically;
   creating an alternating magnetic field in said gap thereby inducing the Hall effect in said disk;
   adjusting the frequency of said alternating electric field to drive said disk to approximately said disk's resonance frequency;
   receiving the signal within said gap generated by said disk; and
   measuring the modulation of said signal to determine said Hall coefficient.

* * * * *